(12) United States Patent
Shieh et al.

(10) Patent No.: US 10,055,523 B2
(45) Date of Patent: Aug. 21, 2018

(54) METHOD FOR ANALYZING OXIDATION IN AN INTERNAL COMBUSTION ENGINE

(71) Applicant: Toyota Motor Engineering & Manufacturing North America, Inc., Erlanger, KY (US)

(72) Inventors: Tenghua Tom Shieh, Ann Arbor, MI (US); Kiyotaka Yamashita, Canton, MI (US); Oana Nitulescu, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 984 days.

(21) Appl. No.: 14/260,942

(22) Filed: Apr. 24, 2014

(65) Prior Publication Data

US 2015/0310138 A1   Oct. 29, 2015

(51) Int. Cl.
*G06F 17/50* (2006.01)
(52) U.S. Cl.
CPC ...... *G06F 17/5018* (2013.01); *G06F 17/5095* (2013.01); *Y02T 10/82* (2013.01)
(58) Field of Classification Search
CPC ... G06F 17/5018; G06F 17/5095; Y02T 10/82
See application file for complete search history.

(56) References Cited

U.S. PATENT DOCUMENTS

| | | | |
|---|---|---|---|
| 4,397,958 A | 8/1983 | Vroom | |
| 4,502,939 A | 3/1985 | Holfelder et al. | |
| 7,017,399 B2 | 3/2006 | Yokohata et al. | |
| 7,332,143 B2 | 2/2008 | Symrniotis et al. | |
| 7,529,616 B2 | 5/2009 | Bizub | |
| 8,500,442 B2 | 8/2013 | Knittel et al. | |
| 2008/0254399 A1 | 10/2008 | Olstowski | |

(Continued)

OTHER PUBLICATIONS

Zhi Wang, Shi-Jin Shuai, Jian-Xin Wang & Fan Zhang (2008) Numerical Simulation of Gasoline Stratified Charge Compression Ignition Using 3D-CFD Coupled with Detailed Chemistry, Combustion Science and Technology, 180:7, 1295-1316, DOI: 10.1080/00102200802049505.*

(Continued)

*Primary Examiner* — Kamini S Shah
*Assistant Examiner* — Steven W Crabb
(74) *Attorney, Agent, or Firm* — Dinsmore & Shohl LLP

(57) ABSTRACT

A process for analyzing incomplete fuel oxidation in an internal combustion engine is provided. The process includes simulating a cylinder with a cylinder wall and a piston within the cylinder for the internal combustion engine. Based on the simulation of the internal combustion engine operation, a pressure and a temperature are determined at a predetermined location within the cylinder for at least one piston crank angle. In addition, combustion of fuel at the predetermined location within the cylinder is simulated and a determination of combustion products is provided. In this manner, simulation of incomplete oxidants produced during operation of the internal combustion engine is afforded and can be used for the design of engine components such as cylinder walls, piston heads, piston rings, valves, spark plugs, and the like.

14 Claims, 4 Drawing Sheets

(56) References Cited

U.S. PATENT DOCUMENTS

| | | | |
|---|---|---|---|
| 2008/0312880 A1* | 12/2008 | McLuckie | G05B 17/02 703/1 |
| 2010/0256954 A1 | 10/2010 | Castella et al. | |
| 2012/0028360 A1 | 2/2012 | Tordoff | |
| 2013/0158967 A1* | 6/2013 | Bohbot | G06F 19/702 703/8 |
| 2013/0316465 A1 | 11/2013 | Steude et al. | |

OTHER PUBLICATIONS

S. Bougrine, S. Richard, J.B. Michel, D. Veynante (2013) Simulation of CO and NO emission in a SI engine using a 0D coherent flame model coupled with a tabulated chemistry approach, Applied Energy vol. 113, pp. 1199-1215.*

Wagner et al., "Aldehydes and ketones in engine exhaust emissions—a review", Proc Instn Mech Engrs vol. 210 (1996).*

Reaction Design Release 4.0, "CHEMKIN Software Theory Manual", RD01400-C01-004-001A (Jun. 2004).*

Rivas, Maria, Pascal Higelin, Christian Caillol, Olivier Sename, Emmanual Witrant, Vincent Talon, "Validation and Application of a New 0D Flame/Wall Interaction Sub Model for Si Engines", JSAE 20119150, SAE 2011-01-1893 (2011), pp. 1-16.*

\* cited by examiner

METHOD FOR ANALYZING OXIDATION IN AN INTERNAL COMBUSTION ENGINE

FIELD OF THE INVENTION

The present invention is related to a process for analyzing incomplete fuel oxidation in an internal combustion engine, and in particular using a combination of 3D-CFD and 0D-CHR simulation to analyze incomplete fuel oxidation in the internal combustion engine.

BACKGROUND OF THE INVENTION

The use of fuel such as gasoline, diesel fuel, natural gas, and the like within internal combustion engines is known. In addition, such internal combustion engines are known to use engine oil to provide lubrication of moving parts. It is also known that degradation of engine oil can be caused, at least in part, by the incorporation of unburned fuel, i.e. fuel that has not been completely oxidized during operation of the internal combustion engine, within the oil.

Currently, engine oil from an internal combustion engine is analyzed after extended operation of the engine in order to determine if unburned fuel is responsible for degradation of the oil. However, such analysis is "after the fact", i.e. after operating the engine and thus can lead to inaccurate results and conclusions. Therefore, a method of analyzing burning/oxidation of fuel during the actual operation of an internal combustion engine would be desirable.

SUMMARY OF THE INVENTION

A process for analyzing incomplete fuel oxidation in an internal combustion engine is provided. The process includes providing a computer environment that is operable to execute algorithms, calculations, simulations, etc. Thereafter, operation of an internal combustion engine having a cylinder with a cylinder wall and a piston within the cylinder is simulated. Based on the simulation of the internal combustion engine operation, a pressure and a temperature is determined or read at a predetermined location within the cylinder for at least one piston crank angle. In addition, the predetermined location is in front of a simulated flame-front in the cylinder proximate to the cylinder wall. The process also includes modeling of a fuel that is used by the internal combustion engine.

After combustion of the modeled fuel has been simulated, the pressure and temperature are read at the predetermined location within the cylinder. The simulation affords a determination of the fuel combustion products, and whether or not incomplete combustion/oxidation of the fuel occurs at the predetermined location and predetermined crank angle. In this manner, simulation of incomplete oxidants produced during operation of the internal combustion engine is afforded and can be used for determination of oil engine degradation, design of engine components such as cylinder walls, piston heads, piston rings, valves, spark plugs, and the like. In addition, such results can guide an automotive engineer into selecting desired and identifying undesired combustion conditions for an internal combustion engine.

The pressure and temperature at the predetermined location within the cylinder and at the predetermined crank angle is determined using a 3D-computational fluid dynamics (3D-CFD) calculation. In addition, simulating combustion of the fuel at the predetermined location within the cylinder is afforded by a 0D-closed homogeneous reactor (0D-CHR) simulation.

The determination of the combustion products of the simulated combusted fuel includes determination of the presence and an amount of at least one species of interest. The at least one species of interest can be an aldehyde, a ketone, and the like. In addition, the aldehyde can be in the form of formaldehyde and/or acetaldehyde. Also, the one or more species of interest can be present in the gas phase, liquid phase, and/or solid phase.

In a preferred embodiment, the at least one predetermined crank angle is between −10° and +10°. In some instances, the at least one predetermined crank angle is at least two predetermined crank angles between −10° and +10°. In a more preferred embodiment, the at least two predetermined crank angles are five predetermined crank angles at −10°, −5°, 0°, +5°, and +10°.

Execution of the process disclosed herein affords for incomplete fuel oxidation analysis within one or more cylinders of an internal combustion engine. The incomplete fuel oxidation analysis provides information related to degradation of engine oil due to unburned fuel components becoming mixed with the engine oil. The incomplete fuel oxidation analysis is also used to improve the efficiency of the internal combustion engine.

DETAILED DESCRIPTION OF THE PRESENT INVENTION

Figure 1:
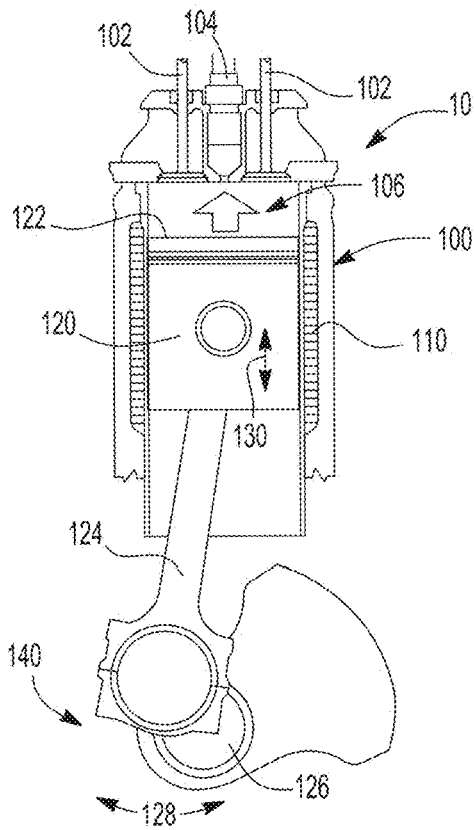
FIG. 1 is a schematic illustration of an internal combustion engine.

A predictive analysis method for analyzing partial oxidation of fuel that can lead to engine oil degradation is provided. The predictive analysis system or process uses a 3D-CFD system for simulating the environment within a cylinder during operation of an internal combustion engine. In particular, the 3D-CFD can simulate flow of an intake gas and air into a cylinder as a piston moves in a reciprocating manner, and spark plug initiated combustion within the cylinder, as known to those skilled in the art. Combustion within a diesel engine cylinder without the use of a spark plug can also be simulated. The 3D-CFD system is provided with inputs such as boundary conditions, operating conditions of the internal engine, etc., and calculates conditions within the cylinder such as pressure, temperature, fuel to air ratio as a function of time. It is appreciated that the function of time can be expressed as a function of crank angle (CA). Naturally, the 3D-CFD system can simulate or calculate such conditions for the various strokes of an internal combustion engine, i.e. the intake, compression, expansion, and exhaust strokes. In this manner, a map of pressure, temperature, etc. within the cylinder can be provided as a function of crank angle.

In order to obtain a more detailed analysis of the combustion products within the cylinder as a function of crank angle, and also to greatly reduce computation time required to obtain the more detailed analysis, the results of the 3D-CFD simulation are transferred or handed off to a 0D-CHR system. The 0D-CHR system affords for simulating: (1) a detailed analysis of fuel to be combusted at a particular location and under the physical conditions simulated by the 3D-CFD system; combustion of the fuel under such conditions; and (3) resulting products of the combustion. In this manner, the inventive process disclosed herein takes advantage of the 3D-CFD system to provide physical conditions within the cylinder and the 0D-CHR to provide a detailed analysis of combustion products resulting from operation of the internal combustion engine. In addition, the inventive process uses the simulated combustion products to predict products leading to engine oil degradation and reduction thereof.

In this manner, a numerical method which affords for calculation of partial oxidation of fuel using 3D-CFD with detailed 0D-CHR chemistry analysis is provided. In addition, a dynamic mechanism reduction with multizone is implemented to shorten the calculation time. In particular, a combination of 3D-CFD and the 0D kinetic approach is used to provide realistic time available results for partial or incomplete fuel oxidation within an internal combustion engine.

The 3D-CFD affords for selecting or knowing a pressure and temperature of a reaction at any given point and time within a combustion chamber such as a cylinder of the internal combustion engine. The pressure and temperature for such a given point is then combined with a fuel composition, upon which a detailed chemical analysis is conducted using the 0D-CHR simulation. The results of the detailed chemical analysis show whether or not partial oxidation of the fuel has occurred and which combustion products or incomplete combustion products are present. In the event that incomplete combustion products are present, the composition, i.e. quantity of such products, is provided and can be used to predict engine oil contamination and degradation.

A process for analyzing incomplete fuel oxidation within the internal combustion engine uses a computer environment to simulate operation of the internal combustion engine. In particular, 3D-CFD allows for the determination of a pressure and a temperature at a predetermined location within the cylinder for at least one predetermined crank angle. In addition, the predetermined location is selected to be in front of a simulated flame-front in the cylinder near or at the cylinder wall. The pressure and temperature determined by the 3D-CFD are combined with a modeled fuel that is used in the internal combustion engine and submitted to a 0D-CHR model for detailed chemical analysis. Stated differently, a combination of fuel chemistry, pressure, and temperature for the fuel at the predetermined location is simulated to burn/oxidize via the 0D-CHR model with determination of incomplete fuel oxidation available. In the event that incomplete fuel oxidation does result, the composition/quantity of at least one species of interest is provided. Based on the amount of the at least one species of interest, prediction of oil contamination is also provided.

Turning now to FIG. 1, a schematic illustration of an internal combustion engine is shown generally at reference numeral 10. The internal combustion engine 10 has a cylinder 100 with a cylinder wall 110. In addition, the cylinder 100 has one or more valves 102, a spark plug 104, and the like. The internal combustion engine 10 also has a piston 120 with a piston face 122, a piston rod 124, and a crank 126. A crank angle 128 can be used to measure where the piston face 122 is at any given time. It is appreciated that fuel is injected into the cylinder, subjected to compression by the piston 120, and combusted to provide force or energy to the piston face 122 which results in a reciprocating motion 130.

Figure 2:
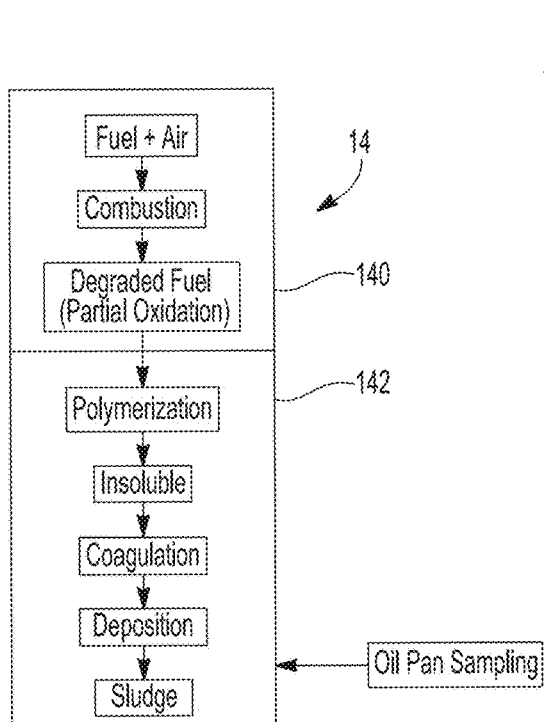
FIG. 2 is a schematic illustration of a prior art process.

With reference to FIG. 2, a prior art process for determining engine oil degradation is shown generally at reference numeral 14. The process essentially includes combusting fuel and air in a cylinder/combustion chamber at 140 which in turn results in degraded fuel, i.e. partial oxidation of the fuel that is combusted. Then, the degraded fuel enters the crankcase and oil pan 142 where polymerization, insolubility, coagulation and/or deposition occur, all of which result in the formation of sludge. Thereafter, sampling is taken from the oil pan in order to determine what constituents make up the sludge. Finally, variables such as type of fuel, air to fuel ratio, combustion chamber dimensions, and the like are varied and the process performed again. Naturally, such a process takes a significant amount of time and man-hours in order to properly investigate and determine which parameters within the combustion chamber are significant with respect to reducing oil degradation.

Figure 3:
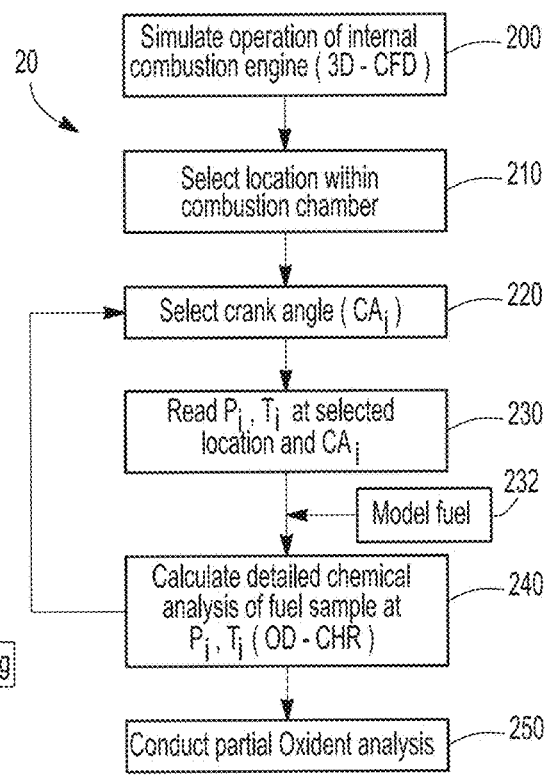
FIG. 3 is a schematic illustration of a process according to an embodiment of the present invention.
Figure 4:
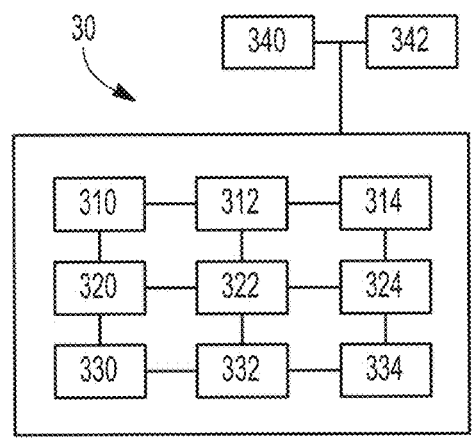
FIG. 4 is a schematic illustration of a computer environment used according to an embodiment of the present invention.

In contrast, and with reference to FIGS. 3 and 4, a predictive analysis system and/or process 20 can be executed within a computer environment 30. The process 20 includes simulating operation of the internal combustion engine 10 at step 200. In addition, a location is selected within the combustion chamber, e.g. cylinder 100, at step 210, and a predetermined crank angle ($CA_i$) is selected at step 220. In some instances, the crank angle is selected between −10° and +10° with 0° being top dead center (TDC) as known to those skilled in the art.

For the particular crank angle selected at step 220, the results of the simulated operation of the internal combustion engine at step 200 are used to read a particular pressure ($P_i$) and temperature ($T_i$) at the selected location and the selected crank angle ($CA_i$) at step 230. The pressure and temperature are combined with a fuel chemistry determined at step 232.

It is appreciated that the fuel chemistry can be the result of modeling of a fuel which may or may not be conducted prior to step 230, step 220, and the like. The combination of the pressure and temperature obtained from step 230 and the fuel chemistry obtained at step 232 are used to calculate a detailed chemical analysis of a fuel sample at the selected location and crank angle at step 240.

The process optionally returns to step 220 where a different crank angle is selected. Thereafter, a determination or reading of the pressure and temperature for the different crank angle occurs at step 230, which in combination with the fuel chemistry obtained at step 232 allows for calculation of another detailed chemical analysis of the fuel sample at the pressure and temperature for the different crank angle. This cycle can continue until detailed chemical analysis of various crank angles is completed. Then, partial oxidation analysis of the resulting calculated detailed chemical analysis occurs at step 250 in order to determine if one or more species of interest are present and to what amount.

The computer environment 30 shown in FIG. 4 can include a computer 300 with an electronic control unit 310, RAM 312, memory 314, and the like. In addition, one or more databases 320-322 and a software module 324 can be included along with a graphics card 330, a sound card 332, and a network card 334. The computer 300 can also have external components such as a monitor 340 and be in communication with an outside system 342, e.g. the Internet, the cloud, etc.

Figure 5:
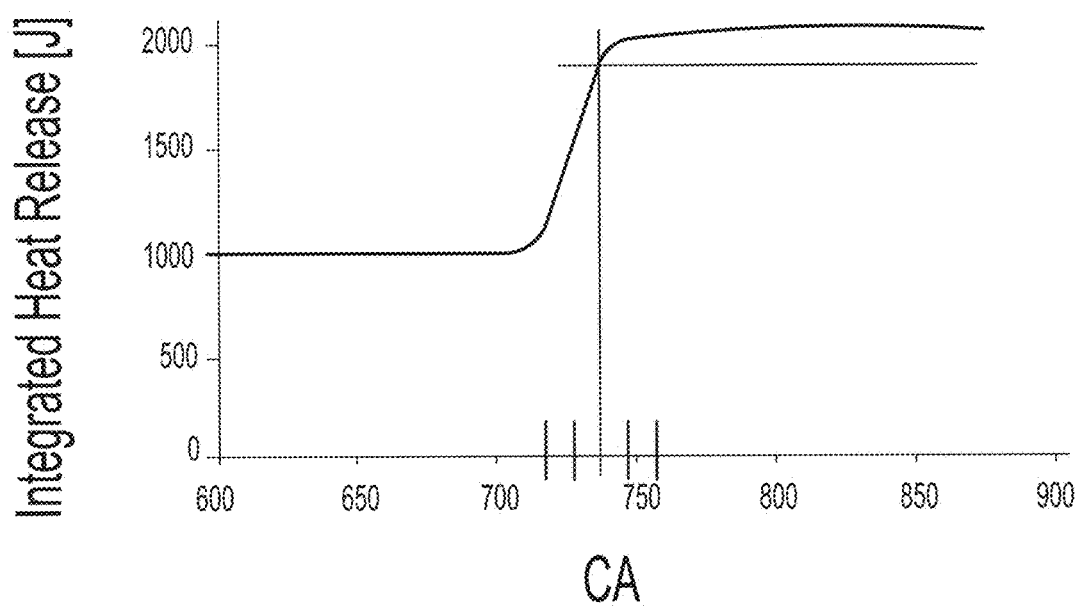
FIG. 5 is graphical plot illustrating a 3D-CFD simulation result for heat release versus crank angle according to an embodiment of the present invention.

The crank angle determined at step 220 can be the result of an analysis of a graphical plot of 3D-CFD data as illustrated in FIG. 5. In particular, a plot of integrated heat release as a function of crank angle can be used to determine a level of 90% burn, i.e. 90% of the total integrated heat release, which can be defined as the zero crank angle. Thereafter, additional crank angles can be selected in reference to the zero crank angle.

Figure 6:
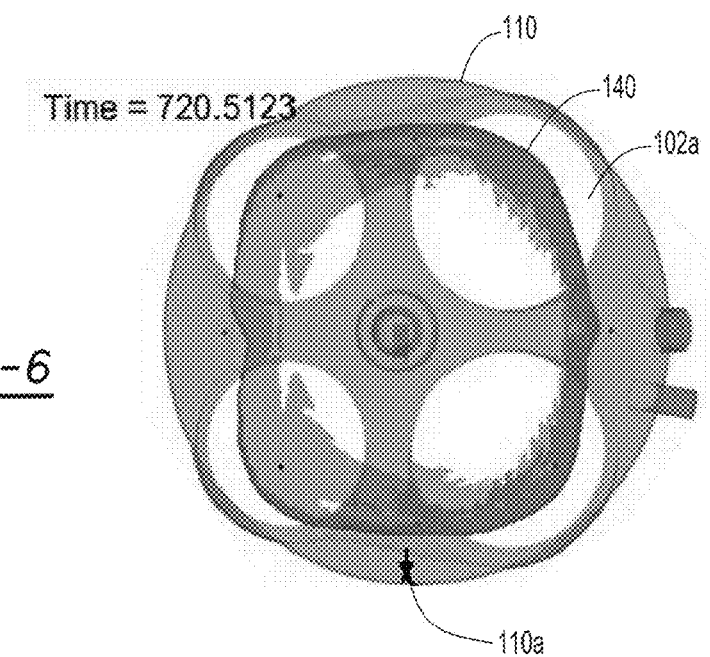
FIG. 6 is a schematic illustration of a simulation result according to an embodiment of the present invention.
Figure 7:
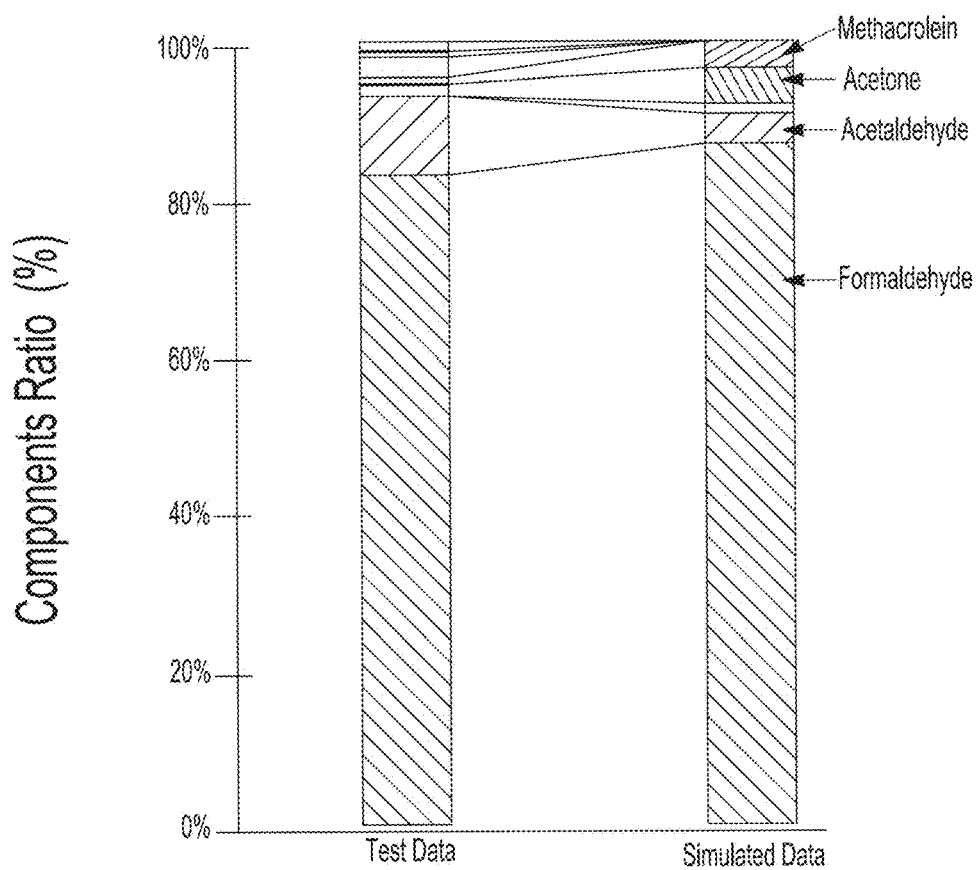
FIG. 7 is a graphical illustration of a 0D-CHR combustion products determination according to an embodiment of the present invention.

Looking now at FIG. 6, a simulated result produced according to an embodiment of the present invention is shown. The figure illustrates a cylinder wall 110, a valve opening 102a and a predetermined location 110a that is proximate to the cylinder wall 110. In addition, a flame-front 140 that has been initiated from a spark from the spark plug 104 is also shown. As such, predetermined location 110a illustrates a typical location within the cylinder 100 where a pressure and a temperature can be read for a selected crank angle, and in combination with a fuel chemistry, be subjected to a detailed chemical analysis using a 0D-CHR model. The results of such an analysis are shown in FIG. 7. FIG. 7 also shows test data obtained from operation of an actual internal combustion engine that was modeled/simulated as disclosed herein. As shown in FIG. 7, formaldehyde, acetaldehyde, acetone and methacrolein were found to be main components in the test data and the simulated data, and reasonable agreement with respect to the quantity of each species was also observed. As such, the process affords for simulation or modeling of incomplete fuel oxidation within an internal combustion engine which can be used to predict species that increase oil degradation.

It is appreciated that the 0D-CHR model can consider and calculate results for a plurality of different fuels that include thousands of species, reactions, and resulting components. For example and for illustrative purposes only, a low phosphorus fuel known as LLNL-LP can be modeled with 110 different species and 88 different reactions. In the alternative, a high phosphorus fuel commonly known as LLNL-HP can be modeled with 138 different species and 629 different reactions. Other fuels include 2004IC8 (i-octane) which has 857 different species and 3606 reactions, MFC2012 gasoline with 2456 different species and 11336 different reactions, and MFC2012 biodiesel with 8460 species and 34027 different reactions. It should be appreciated that conducting such an analysis with a 3D-CFD system/program is simply not practical. Therefore, the inventive system that models operation of the internal engine using the 3D-CFD system and then handing off physical properties within the combustion chamber to the 0D-CHR system provides for detailed analysis not heretofore known. Exemplary components that can be included and modeled within the fuels are formaldehyde, acetaldehyde, acraldehyde, dimethyl ketone, propionaldehyde, crotonaldehyde, methacrylaldehyde, isobutyraldehyde, methyl ethyl ketone, buthyl methyl ketone, isopentaldehyde, valeraldehyde, isohexanal, hexanaldehyde, benzaldehyde, and m-tolualdehyde.

Figure 8:
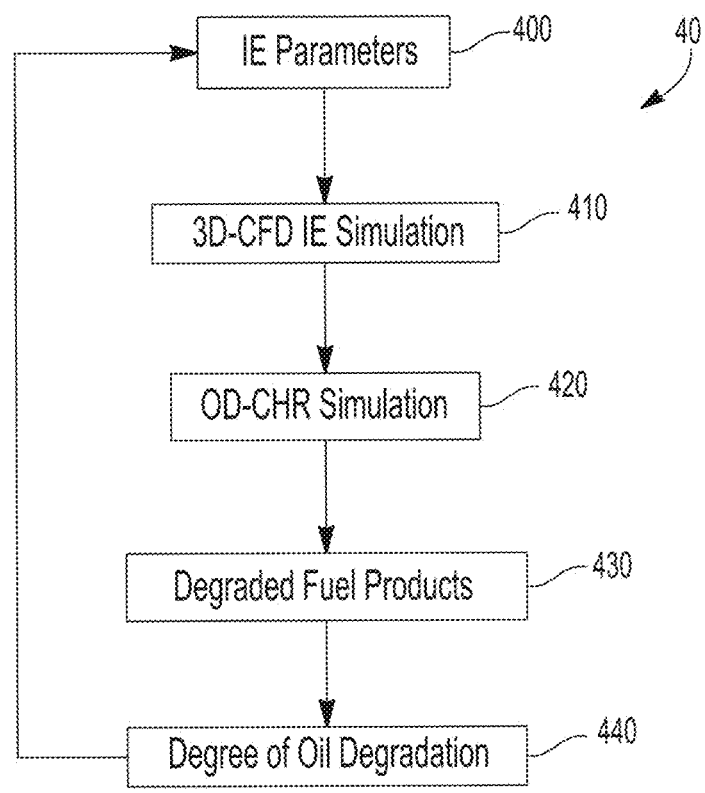
FIG. 8 is a schematic illustration of a predictive process for determining and reducing oil degradation according to an embodiment of the present invention.

FIG. 8 shows an overall summary of an inventive process according to an embodiment of the present invention at reference numeral 40. The process 40 includes selecting parameters for an internal combustion engine (IE) at step 400. The parameters can include boundary conditions and engine operating conditions for the engine. For example, parameters such as piston shape, cylinder size, liner temperature, fuel droplet size, fuel spray angle, ignition timing, RPM, and the like can be selected. Thereafter, 3D-CFD internal engine simulation is performed at step 410 and physical properties such as temperature and pressure for one or more locations within the cylinder are handed off to the 0D-CHR system where simulation occurs at step 420. As a result of the 0D-CHR simulation, the composition and amount of degraded fuel products is determined at step 430 and the degree of oil degradation as a function of the degraded fuel products is determined at step 440. Thereafter, the process can return to step 400 where the internal engine parameters can be adjusted, modified, etc. and steps 410-440 repeated. In this manner, a predictive analysis of internal engine parameters, types of fuel to be used, and the like which decrease or increase oil degradation is provided. It is appreciated that the 0D-CHR simulation at step 420 can include simulation of a particular fuel that is included in the overall analysis.

As such, the method or process disclosed herein affords for simulated partial fuel oxidation within an internal combustion engine. In addition, it is appreciated that such results can aid in designing future internal engine components such as cylinders, pistons, valve heads, spark plugs, and the like. In addition, such simulation results can guide an automotive engineer in selecting or avoiding engine operating conditions.

The invention is not limited to the embodiments, examples, etc. disclosed above. It is appreciated that changes, modifications, etc. can be made by one skilled in the art and still fall within the scope of the invention. As such, the scope of the invention is defined by the claims and all equivalents thereof.

We claim:

1. A process for analyzing incomplete fuel oxidation in an internal combustion engine in order to predict degraded fuel products that increase degradation of oil in the internal combustion engine, the process comprising:
    simulating operation of an internal combustion engine within a computer environment operable to execute algorithms, calculations and simulations, the internal combustion engine comprising internal parameters including a cylinder with a cylinder wall and a piston within the cylinder;
    determining a pressure and a temperature at a predetermined point within the cylinder for at least one predetermined crank angle for the piston within the cylinder using a 3D-computational fluid dynamics (3D-CFD) simulation, the predetermined point being in front of a simulated flame-front in the cylinder proximate to the cylinder wall;
    modeling a fuel;
    simulating combustion of the fuel at the determined pressure, temperature and predetermined point within the cylinder using a 0D-closed homogeneous reactor (0D-CHR) simulation;
    determining combustion products of the simulated combusted fuel at the predetermined point;
    conducting a partial oxidation analysis of the determined combustion products;
    determining species of incomplete fuel oxidation for the purpose of determining oil degradation as a function of the species of incomplete fuel oxidation; and
    adjusting the internal parameters of the internal combustion engine based on the partial oxidation analysis and the determined oil degradation.

2. The process of claim 1, wherein determining combustion products of the simulated combusted fuel at the predetermined location includes determination of an amount of at least one species of interest selected from the group consisting of an aldehyde and a ketone.

3. The process of claim 2, wherein the at least one species of interest is selected from the group consisting of formaldehyde and acetaldehyde.

4. The process of claim 2, wherein the at least one species of interest is present in a gas phase.

5. The process of claim 1, wherein the at least one predetermined crank angle is between −10° to +10°.

6. The process of claim 5, wherein the at least one predetermined crank angle comprises a first angle and a second angle different than the first angle, the first angle and the second angle are between −10° to +10°, and the pressure and temperature are determined at the first angle and the second angle sequentially.

7. The process of claim 5, wherein the at least one predetermined crank angle is five predetermined crank angles at −10°, −5°, 0°, +5° and +10°, and the pressure and temperature are determined at the five predetermined angles sequentially.

8. A process for analyzing incomplete fuel oxidation in an internal combustion engine in order to predict degraded fuel products that increase degradation of oil in the internal combustion engine, the process comprising:
   simulating operation of an internal combustion engine using a computer having an electronic control unit (ECU), memory, a database and a software module, the computer operable to execute algorithms, calculations and simulations, the internal combustion engine comprising internal parameters including a cylinder with a cylinder wall and a piston within the cylinder;
   determining pressures and temperatures at a predetermined point within the cylinder for at least one predetermined crank angle using a 3D-computational fluid dynamics (3D-CFD) simulation;
   reading a temperature and a pressure from the determined pressures and temperatures for the predetermined point, the predetermined point being in front of a simulated flame-front in the cylinder proximate the cylinder wall;
   modeling a fuel;
   simulating combustion of the modeled fuel at the predetermined point within the cylinder using a 0D-closed homogeneous reactor (0D-CHR) simulation; and
   determining combustion products of the simulated combusted fuel at the predetermined point;
   conducting a partial oxidation analysis of the determined combustion products;
   determining species of incomplete fuel oxidation for the purpose of determining oil degradation as a function of the species of incomplete fuel oxidation; and
   adjusting the internal parameters of the internal combustion engine based on the partial oxidation analysis and the determined oil degradation.

9. The process of claim 8, wherein the combustion products include aldehydes and ketones.

10. The process of claim 9, wherein the combustion products include formaldehyde and acetaldehyde.

11. The process of claim 10, wherein the combustion products are present in a gas phase.

12. The process of claim 11, wherein the at least one predetermined crank angle comprises a first angle and a second angle different than the first angle, the first angle and the second angle are between −10° to +10°, and the pressures and temperatures are determined at the first angle and the second angle sequentially.

13. The process of claim 8, wherein the at least one predetermined crank angle is between −10° to +10°.

14. The process of claim 13, wherein the at least one predetermined crank angle is five predetermined crank angles at −10°, −5°, 0°, +5° and +10°, and the pressures and temperatures are determined at the five predetermined angles sequentially.

* * * * *